US006664156B1

United States Patent
Ang et al.

(10) Patent No.: US 6,664,156 B1
(45) Date of Patent: Dec. 16, 2003

(54) METHOD FOR FORMING L-SHAPED SPACERS WITH PRECISE WIDTH CONTROL

(75) Inventors: Chew Hoe Ang, Singapore (SG); Eng Hua Lim, Singapore (SG); Wenhe Lin, Singapore (SG); Jia Zhen Zheng, Singapore (SG)

(73) Assignee: Chartered Semiconductor Manufacturing, LTD, Singapore (SG)

( * ) Notice: Subject to any disclaimer, the term of this patent is extended or adjusted under 35 U.S.C. 154(b) by 0 days.

(21) Appl. No.: 10/209,573

(22) Filed: Jul. 31, 2002

(51) Int. Cl.$^7$ .............................................. H01L 21/311
(52) U.S. Cl. ...................... 438/229; 438/303; 438/479; 438/703; 438/696; 438/738
(58) Field of Search .................. 438/201, 211, 438/229, 230, 299, 303, 479, 492, 696, 703, 738, 743, FOR 188

(56) References Cited

U.S. PATENT DOCUMENTS

| | | | | |
|---|---|---|---|---|
| 5,024,959 | A | * | 6/1991 | Pfiester |
| 5,153,145 | A | * | 10/1992 | Lee et al. |
| 5,290,720 | A | * | 3/1994 | Chen |
| 5,430,313 | A | * | 7/1995 | Kumagai et al. |
| 5,714,413 | A | * | 2/1998 | Brigham et al. |
| 5,770,508 | A | * | 6/1998 | Yeh et al. |
| 5,783,475 | A | * | 7/1998 | Ramaswami |
| 5,914,519 | A | * | 6/1999 | Chou et al. |
| 6,124,158 | A | * | 9/2000 | Dautartas et al. |
| 6,156,598 | A | * | 12/2000 | Zhou et al. |
| 6,277,683 | B1 | | 8/2001 | Pradeep et al. ............. 438/200 |
| 6,294,480 | B1 | | 9/2001 | Pradeep et al. ............. 438/763 |
| 6,297,539 | B1 | | 10/2001 | Ma et al. ..................... 257/410 |
| 6,346,468 | B1 | | 2/2002 | Pradeep et al. ............. 438/595 |
| 6,348,386 | B1 | | 2/2002 | Gilmer ........................ 438/228 |
| 6,380,039 | B2 | | 4/2002 | Badenes et al. ............. 438/301 |
| 6,391,803 | B1 | | 5/2002 | Kim et al. ................... 438/787 |
| 6,403,156 | B2 | * | 6/2002 | Jang et al. |
| 6,444,559 | B2 | * | 9/2002 | Kim et al. |
| 6,509,601 | B1 | * | 1/2003 | Lee et al. |
| 2001/0054730 | A1 | * | 12/2001 | Kim et al. |
| 2002/0021544 | A1 | * | 2/2002 | Cho et al. |
| 2002/0177282 | A1 | * | 11/2002 | Song |
| 2003/0027360 | A1 | * | 2/2003 | Hsu et al. |

\* cited by examiner

Primary Examiner—George Fourson
Assistant Examiner—Joannie Adelle Garcia

(57) ABSTRACT

A method of fabrication of L-shaped spacers in a semiconductor device. A gate structure is provided over a substrate. We form a first dielectric layer over the gate dielectric layer and the substrate. Next, a second dielectric layer is formed over the first dielectric layer. Then, we form a third dielectric layer over the second dielectric layer. The third dielectric layer is anisotropically etched to form a disposable spacer on the second dielectric layer. The second dielectric layer and the first dielectric layer are anisotropically etched using the disposable spacer as a mask to form a top and a bottom L-shaped spacer. The disposable spacer is removed. In preferred embodiments, the first, second and third dielectric layers are formed by atomic layer deposition (ALD) or ALCVD processes.

17 Claims, 3 Drawing Sheets

US 6,664,156 B1

METHOD FOR FORMING L-SHAPED SPACERS WITH PRECISE WIDTH CONTROL

BACKGROUND OF INVENTION

1) Field of the Invention

The preferred embodiments of the invention relate generally to fabrication of semiconductor devices and more particularly to the fabrication of a device with sidewall spacers and more particularly to a method for forming sidewall spacers for a gate structure.

2) Description of the Prior Art

As the physical geometry of semiconductors continues to shrink, the space between gate electrodes shrinks as well. As design rules shrink, it is important to reduce the size of the elements for transistors.

One approach which has been used to solve this problem is the use of spacers on the gate electrode sidewalls which are smaller at the top than they are at the bottom, such as L-shaped spacers. In a typical L-shaped spacer two dielectric layers (the first composed of silicon nitride and the second composed of silicon oxide) are formed over and around a gate electrode, then anisotropically etched. However, the top oxide portion of the spacer can not be easily removed without damaging oxide isolation structures. Conversely, if the top oxide portion of the spacer remains, it can be affected by post-etch wet chemical process causing inconsistent spacer shape and size across the IC and between IC's. Furthermore, furnace based LPCVD $SiO_2$/SiN film stacks are formed at high temperatures and are relatively difficult to control spacer widths.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents. U.S. Pat. No. 6,380,039B2(Badenes et al.) shows a process for an L-shaped spacer.

U.S. Pat. No. 6,294,480b1(Pradeep et al.) and U.S. Pat. No. 6,346,468b1(Pradeep et al.) show other processes for spacers.

U.S. Pat. No. 6,277,683b1(Pardeep et al.) reveals another process for an L-shaped spacer.

U.S. Pat. No. 6,348,386b1(Gilmer) shows a process for a gate dielectric layer.

U.S. Pat. No. 6,297,539b1(Ma et al.) discloses a gate dielectric layer processes.

SUMMARY OF THE INVENTION

It is an object of an embodiment of the present invention to provide a method for fabricating spacers in a semiconductor device.

It is an object of an embodiment of the present invention to provide a method for fabricating L-shaped spacers using atomic layer deposition (ALD) processes in a semiconductor device.

An embodiment of the present invention provides a method of fabrication of L-shaped spacers in a semiconductor device. A gate structure is provided over a substrate. We form a first dielectric layer over the gate dielectric layer and the substrate. Next, a second dielectric layer is formed over the first dielectric layer. Then, we form a third dielectric layer over the second dielectric layer. The third dielectric layer is anisotropically etched to form a disposable spacer on the second dielectric layer. The second dielectric layer and the first dielectric layer are anisotropically etched using the disposable spacer as a mask to form a top and a bottom L-shaped spacer. The disposable spacer is removed.

In preferred embodiments, the first, second and third dielectric layers are formed by atomic layer deposition (ALD).

In preferred embodiments, the first, second and third dielectric layers are formed by atomic layer deposition (ALD) processes. The second and third dielectric layers preferably have different etch characteristics to that the third dielectric layer can be etched selectively to the second dielectric layer.

The embodiments preferably use atomic layer deposition (ALD) processes to form spacers, as ALD processes can grow films with precise thickness control. This is an advantage because the width of the spacer will after the source/drain extension series resistance and hence the drive current.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

A preferred embodiment of the invention is described below. This preferred embodiment is a method for fabricating of L shaped spacers in a semiconductor device. The embodiment is shown in FIGS. 1 to 5. The preferred embodiment forms spacers preferably using an atomic layer deposition (ALD) or ALCVD (atomic layer chemical vapor deposition).

Figure 1:
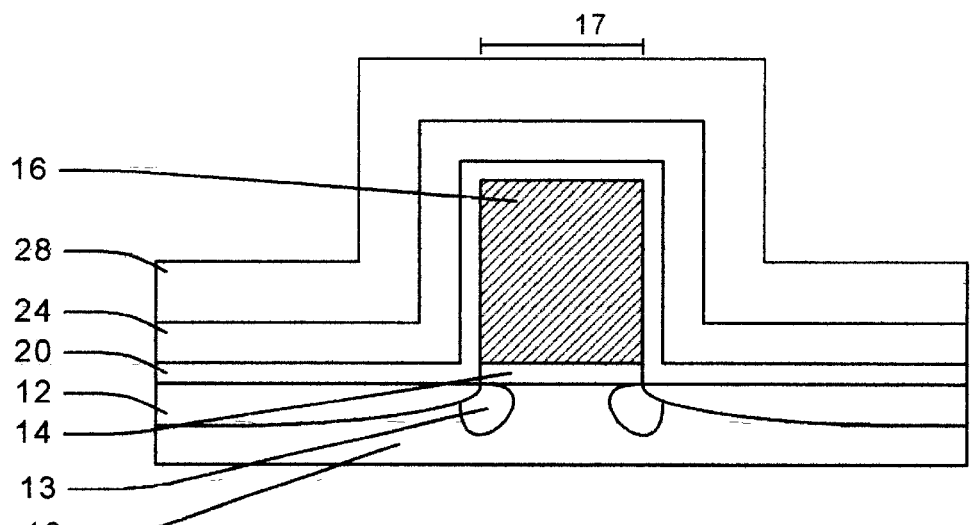
FIG. 1 is a cross sectional view for illustrating a method for fabricating a L-shaped spacer according to an embodiment of the present invention.

Referring to FIG. 1, a gate structure (e.g., 16 14) is provided over a substrate 10. Substrate can be a silicon substrate or any other suitable semiconductor substrate, such as a substrate comprising GaAs, SiGe or a SOI substrate. The substrate can further include wells, isolation regions and other devices. Further, substrate 10 is illustrated as a single layer in FIG. 1 to simplify the drawings and explanation, since such additional layers are not relevant to this embodiment.

The gate structure 14 16 is preferably comprised of a gate dielectric layer 14 and an overlying gate 16. The gate structure could be other gate structures such as memory gate with control gates and floating gates. The gate 16 can be comprised of one or more layers.

The gate structure is preferably comprised of a gate dielectric layer 14 and an overlying gate 16. The gate structure can be a conductive line such as a word line in a memory device.

The gate dielectric layer 14 can be comprised of an silicon oxide (e.g., $SiO_2$) or any high k dielectric such as hafnium oxide ($HfO_2$), zirconium oxide ($ZrO_2$). Preferably the gate dielectric layer comprised of oxide and preferably has a thickness between 8 and 50 Å. The gate dielectric layer can be formed using an ALD process.

Preferably the gate can be comprised of metal, silicide, or polysilicon and is preferably comprised of polysilicon and preferably has a width 17 of between about 0.01 $\mu$m and 2.0 $\mu$m and the gate has a height between about 1000 and 3000 Å. Gates can be closely spaced and with the embodiments L-Shaped spacers, the space between adjacent gates is preferably between 0.01 $\mu$m to 0.9 $\mu$m (10 nm to 90 nm).

Next, preferably we form light doped source and drain regions adjacent the gate structure in the substrate 10. The lightly doped source and drain regions 12 preferably have an As concentration between 1E13 and 1E16 $cm^{-2}$ and a depth from the substrate surface between 300 and 600 Å.

Next, preferable, we form pocket implant regions 13 by implanting ions having the opposite impurity type as the LDD regions 12 into the substrate 10 to form pocket implant regions 13. The pocket implants 13 can be preferably formed by implanting Boron ions at an energy between 5 and 25 KeV, at a dose between 1E13 and 1E14 $cm^{-2}$ to form pocket implant regions with a depth below the surface between 50 and 200 Å with a resistivity between 2 ohms per square and 100 ohms per square. The pocket implant regions can be also be formed before the LDD regions.

Still referring to FIG. 1, we form a first dielectric layer 20 over the gate dielectric layer 14 and the substrate 10.

The first dielectric layer 20 is preferably formed by an atomic layer deposition (ALD) process and is preferably comprised of oxide, hafnium oxide ($HfO_2$), or zirconium oxide ($ZrO_2$). The first dielectric layer 20 has a thickness of between about 50 and 200 Å. The first dielectric layer preferably formed at a temperature below 500° C. Hafnium oxide can be formed in a ALD process using hafnium tetraiodide and a source of oxygen.

In a more preferred embodiment, the first dielectric layer 20 is comprised of silicon oxide formed by an atomic layer deposition (ALD) process preferably using tetraisocyanatesilane (TICS) and water ($H_2O$). The first dielectric layer 20 preferably has a thickness of between about 50 and 200 Å. The first dielectric layer is preferably formed at a temperature below 500° C. and preferably at a temperature between about 200 and 400 ° C. for a time between 600 and 700 seconds. This contrasts with LPCVD process that are performed at temperatures between 600 and 700 ° C. for a time between 20 and 40 minutes.

Next, we preferably form a second dielectric layer 24 over the first dielectric layer 20.

The second dielectric layer is preferably formed by an ALD or ALCVD process. The second dielectric layer can be comprised of silicon nitride or aluminum oxide and preferably has thickness between 150 and 300 Å.

In a more preferred embodiment, the second dielectric layer 24 is comprised of aluminum oxide (e.g., $Al_2O_3$) formed by an atomic layer deposition (ALD) or ALCVD process using trimethyaluminum (TMA), ozone and water ($H_2O$). The second dielectric layer 24 is preferably formed at a temperature between 400 and 450° C. for a time between 50 and 1000 seconds.

Still referring to FIG. 1, we form a third dielectric layer 28 over the second dielectric layer.

The third dielectric layer 28 is preferably formed by an atomic layer deposition (ALD) process. The third dielectric layer 28 is preferably comprised of oxide, hafnium oxide ($HfO_2$), or zirconium oxide ($ZrO_2$). The third dielectric layer 28 is preferably formed at a temperature between 200 and 400 C and for a time between 50 and 2000 seconds. The third dielectric layer preferably has a thickness between 300 and 700 Å.

In a more preferred embodiment, the third dielectric layer 28 is preferably comprised of silicon oxide, formed by a an atomic layer deposition (ALD) process. The third dielectric layer 28 is preferably formed at a temperature between 200 and 400° C. The third dielectric layer 28 is preferably formed by an atomic layer deposition (ALD) process using tetraisocyanatesilane (TICS) and water ($H_2O$) as described above.

For an ALD process for silicon oxide, the silicon source (e.g, tetraisocyanatesilane (TICS)) and oxygen source (e.g., water and ozone) are alternately flowed into reaction chamber with purging of reaction chamber between these steps. In an ALD process, one of the selected materials is flowed so as to deposit one molecule thickness of that material onto the wafer, and the remaining material is removed through exhaust. After that, the other material is flowed to form another molecule thickness and react with the previously deposited layer. The thickness in such a case is determined by the number of cycles that are run.

Atomic layer chemical vapor deposition (ALCVD) is a type of atomic layer deposition (ALD).

In ALCVD, reactants are supplied in impulses, separated from each other in the flow stream by a purge gas. Each reactant pulse chemically reacts with the surface. It is the chemical reactions between the reactants and the surface that make ALCVD a self-limiting process inherently capable of achieving precise monolayer growth.

ALCVD can be used to deposit a variety of materials, including II-Vi and III-V compound semiconductors, elemental silicon, silicon dioxide and metal oxides and nitrides. When ALCVD is used to deposit a film containing a metal such as Al, Ta, Hf, etc., and a non-metal constituent such as O or N, the first reactant can contain the metal and the second non-metal. The first pulse deposits a metal—containing layer and the second one reacts with that layer to form a complete film of metal oxide or metal nitride. Bother reactancts react chemically with the surface on which they deposit, and each reaction is self limiting. Thus, ALCVD is a self-limiting, wholly conformal process, enabling film thickness control to previously impossible accuracy levels. Film thickness can be controlled within a monolayer solely by counting pulses. ALCVD typically has a low deposition rate, on the order of 0.1 nm/cycle, where each cycle lasts a few seconds. However, such rates are suitable for ultra thin films whose thickness ranges from 0.3 to 10 nm.

The spacer stack layers (e.g., first, second and third dielectric layers 20 24 28) can be deposited in a single chamber or the ALD tool without transferring to other chambers.

For example, the first, second and third dielectric layers 20 24 28 can be formed in-situ using atomic layer deposition (ALD) processes. The depositions can be performed in the same chamber without removing the wafer(s). For example, an ALD tool by Genus, INC. or ASM International can used. Different reactants are supplied for each dielectric layer.

Tables A to D below show different preferred combinations of the materials the first, second and third dielectric layers 20 24 28 can be formed.

TABLE A

Option 1 - Compositions for 1$^{st}$, 2$^{nd}$ and 3$^{rd}$ dielectric layers and the etch chemistries.

| Layer | Material | etch chemistry |
|---|---|---|
| 1$^{st}$ dielectric layer 20 | SiO$_2$ | Hf |
| 2$^{nd}$ dielectric layer 24 | Al$_2$O$_3$ | — |
| 3$^{rd}$ dielectric layer 28 | SiO$_2$ | —CHF4 |

TABLE B

Option 2: Compositions for 1$^{st}$, 2$^{nd}$ and 3$^{rd}$ dielectric layers

| Layer | Material |
|---|---|
| 1$^{st}$ dielectric layer 20 | HfO2, ZrO2 |
| 2$^{nd}$ dielectric layer 24 | SiO$_2$ |
| 3$^{rd}$ dielectric layer 28 | HfO$_2$, ZrO$_2$ |

TABLE C

Option 3: Compositions for 1$^{st}$, 2$^{nd}$ and 3$^{rd}$ dielectric layers

| Layer | Material |
|---|---|
| 1$^{st}$ dielectric layer 20 | SiO$_2$ |
| 2$^{nd}$ dielectric layer 24 | SiN |
| 3$^{rd}$ dielectric layer 28 | SiO$_2$ |

TABLE D

Option 4: Compositions for 1$^{st}$, 2$^{nd}$ and 3$^{rd}$ dielectric layers

| Layer | Material |
|---|---|
| 1$^{st}$ dielectric layer 20 | HfO$_2$ |
| 2$^{nd}$ dielectric layer 24 | Al$_2$O$_3$ |
| 3$^{rd}$ dielectric layer 28 | HfO$_2$ |

Figure 2:
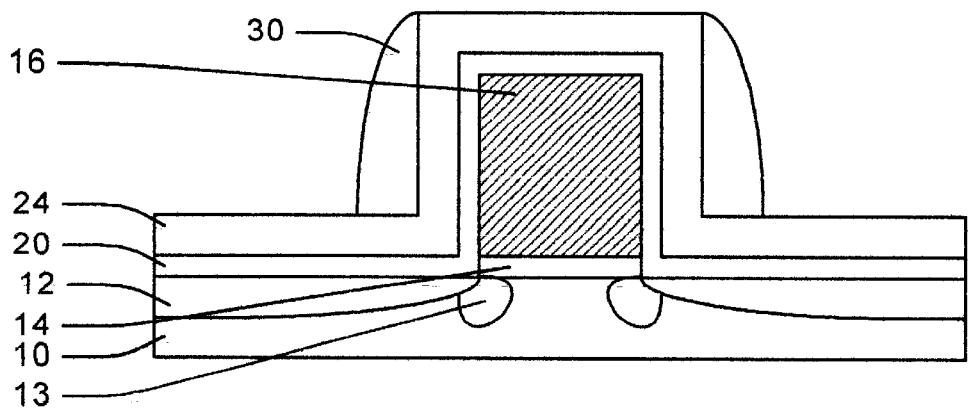
FIG. 2 is a cross sectional view for illustrating a method for fabricating a L-shaped spacer according to an embodiment of the present invention.

As shown in FIG. 2, we anisotropically etch the third dielectric layer 28 to form a disposable spacer 30 over the second dielectric layer 24.

The anisotropic etch preferably uses an etch chemistry with a selectivity greater than 10 between the third dielectric layer 28 to the second dielectric layer 24. For example, for a third dielectric layer comprised of SiO$_2$ and a second dielectric layer comprised of Al$_2$O$_3$, the anisotropic etch preferably uses an etch chemistry comprised of CF$_4$, or CHF$_3$ to achieve a selectivity greater than 10 between the third dielectric layer to the second dielectric layer 24.

The disposable spacer 30 preferably has a width of between about 300 and 700 Å and a height between about 500 and 2000 Å.

Figure 3:
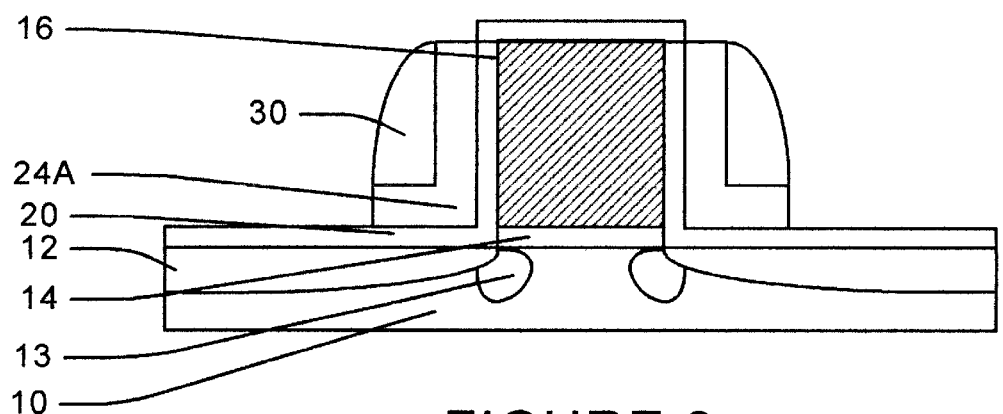
FIG. 3 is a cross sectional view for illustrating a method for fabricating a L-shaped spacer according to an embodiment of the present invention.

As shown in FIG. 3, we etch the second dielectric layer 24 and the first dielectric layer 20 using the disposable spacer 30 as a mask to form top 24A and bottom 20A L-shaped spacers. Preferably the etch is an anisotropic etch. This etch can be a two step etch with etchants selective to the materials of the second and first dielectric layers.

Figure 4:
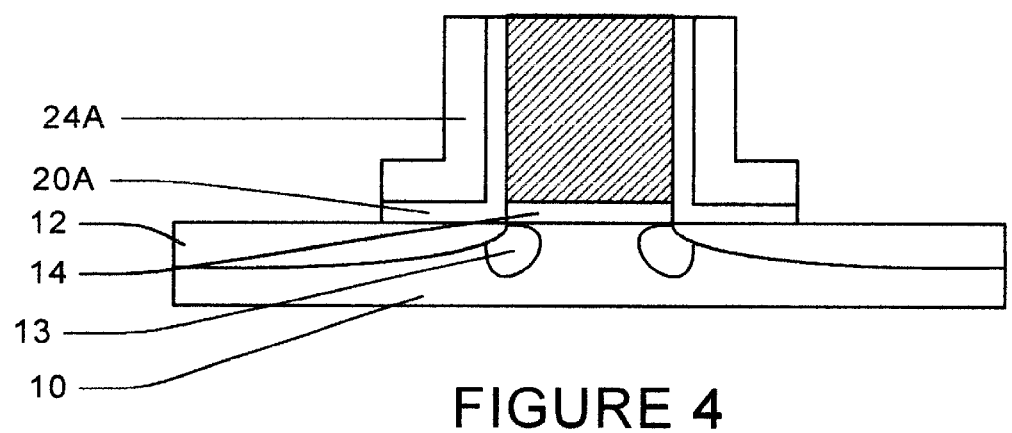
FIG. 4 is a cross sectional view for illustrating a method for fabricating a L-shaped spacer according to an embodiment of the present invention.

As shown in FIG. 4, we remove the disposable spacer 30.

The removal of the disposable spacer 30 is preferably performed using an etch selective to the material of the disposable spacer with the material of the top L-shaped spacer 24A. For example for a disposable spacer 30 made of SiO$_2$, HF can be used to remove the disposable spacer and not etch the underlying top spacer 24A made of Al$_3$O$_2$.

The etches for the third, second and first dielectric layers can be performed in-situ. The etch can be a multi-step etch, such as a one, two or three step etch.

Figure 5:
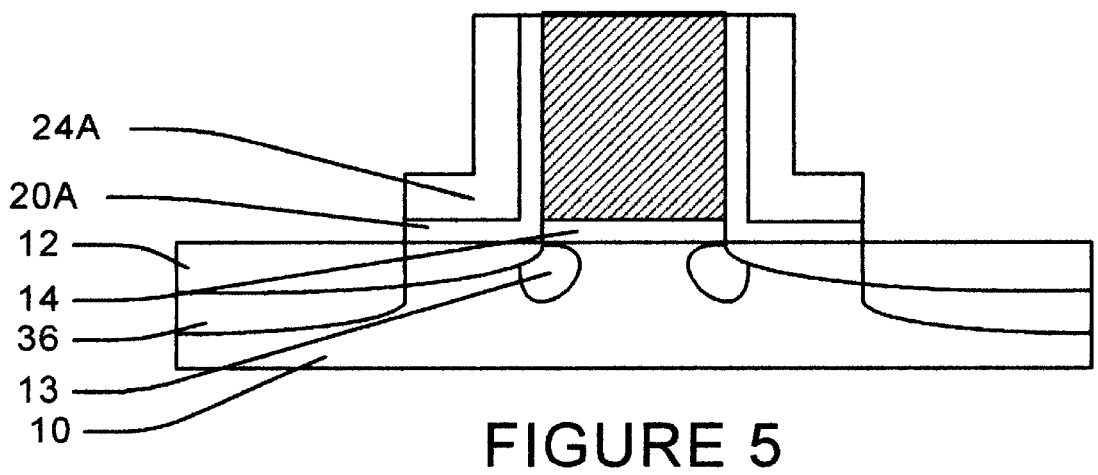
FIG. 5 is a cross sectional view for illustrating a method for fabricating a L-shaped spacer according to an embodiment of the present invention.

As shown in FIG. 5, we form source and drain regions 36 adjacent to the top and bottom L-shaped spacers. The source and drain regions are preferably formed using an implant process.

The source and drain regions 36 preferably are doped with As.

The preferred embodiments of the invention provide methods for forming L-shaped spacers with the following advantages:

Very low thermal budget since all three dielectric layers are deposited at temperatures below 500° C. The inventors have found that as design rules shrink below 0.1 $\mu$m, it is important to reduce the thermal budget after LDD and pocket implant steps in order to achieve high device performance. Also, the inventors have found that device performance is becoming more sensitive to LDD's series resistance. The embodiments' low thermal budget does not impact the LDD's doping profile, unlike conventional processes with higher thermal budgets. The inventors have recognized the LDD profile requirements for the design rules less than 0.1 $\mu$m.

The spacer width can be controlled to nearly atomic layer precision because the ALD process grows layer by layer with an accuracy of about 5 Å.

The LDD resistance can be better controlled because the spacer widths can be better controlled using the invention's L-shaped spacer process and ALD depositions.

The spacer stack layers (e.g., first, second and third dielectric layers) can be performed in a single chamber without transferring. As a result, less equipment foot space and reduce equipment cost.

The spacer film stack formed by the ALD process is very conformal.

The embodiment's atomic layer deposition (ALD) process used to form spacers, can grow films with precise thickness control. This is an advantage because it provides good gapfill for closely spaced gates.

The width of the spacers will affect the source/drain extensions (LLD) (LDD) series resistance and hence the drive current.

The ALD L-shaped spacers permit filling the spaces between closely spaced gates.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of L-shaped spacers in a semiconductor device, comprising the steps of:
   a) providing a gate structure over a substrate;
   b) forming a first dielectric layer over said gate structure and said substrate; said first dielectric layer formed using an atomic layer deposition process;
   c) forming a second dielectric layer over said first dielectric layer; said second dielectric layer formed using an atomic layer deposition process;
   d) forming a third dielectric layer over said second dielectric layer; said third dielectric layer formed using an atomic layer deposition process; the steps of forming said first dielectric layer, said second dielectric layer and said third dielectric layer are performed in-situ using an atomic layer chemical vapor deposition process;
   e) etching said third dielectric layer to form a disposable spacer on said second dielectric layer;
   f) anisotropically etching said second dielectric layer and said first dielectric layer using said disposable spacer as a mask to form a top and a bottom L-shaped spacer; and
   g) removing said disposable spacer.

2. The method of claim 1 wherein at least two gate structures are provided;
   and top and bottom L-shaped spacers are formed on said gate structures;
   a space between adjacent gate structures is between 0.01 $\mu$m to 0.9 $\mu$m.

3. The method of claim 1 wherein said first dielectric layer is comprised of silicon oxide, said second dielectric layer is comprised of aluminum oxide, and said third dielectric layer is comprised of silicon oxide.

4. The method of claim 1 wherein said first dielectric layer is comprised of a material selected from the group consisting of hafnium oxide and zirconium oxide, said second dielectric layer is comprised of silicon oxide; and said third dielectric layer is a material selected from the group consisting of hafnium oxide and zirconium oxide.

5. The method of claim 1 wherein said first dielectric layer is comprised of a material selected from the group consisting of hafnium oxide and zirconium oxide, said second dielectric layer is comprised of aluminium oxide; and said third dielectric layer is comprised of a material selected from the group consisting of hafnium oxide and zirconium oxide.

6. The method of claim 1 wherein the steps of forming said first dielectric layer, said second dielectric layer and said third dielectric layer are performed in-situ using an atomic layer deposition (ALD) process in the same chamber; said first dielectric layer has thickness between 50 and 200 Å, said second dielectric layer has a thickness between 130 and 300 Å and said third dielectric layer has a thickness between 300 and 700 Å.

7. The method of claim 1 which farther includes before the step of forming said first dielectric layer,
   forming lightdoped source and drain regions adjacent said gate structure in said substrate.

8. The method of claim 1 which further includes: forming source and drain regions adjacent to said top and bottom L-shaped spacers and forming a pocket implant in said substrate.

9. The method of claim 1 wherein said gate structure comprised of a gate dielectric layer and an overlying gate; said gate dielectric layer is comprised of silicon oxide; said gate dielectric layer has a thickness between 8 and 50 Å; said gate is comprised of polysilicon, said gate has a width of between about 0.01 and 2 $\mu$m and said gate has a height between about 1000 and 3000 Å.

10. The method of claim 1 wherein said first dielectric layer is comprised of a material selected from the group consisting of oxide, hafnium oxide ($HfO_2$), and zirconium oxide ($ZrO_2$), said first layer has a thickness of between about 50 and 200 Å; said first dielectric layer formed at a temperature below 500° C.

11. The method of claim 1 wherein said third dielectric layer formed by an atomic layer deposition (ALD) process using tetraisocyanatesilane (TICS) and water; said third dielectric layer comprised of oxide, said third dielectric layer formed at a temperature between 200 and 400° C.

12. The method of claim 1 wherein said third dielectric layer formed by an atomic layer deposition (ALD) process, said third dielectric layer comprised of a material selected from the group consisting of: oxide, hafnium oxide, and zirconium oxide; said third dielectric layer formed at a temperature between 200 and 400° C.

13. The method of claim 1 wherein said disposable spacer has a width of between about 300 and 700 Å and a height between about 50 and 1500 Å.

14. The method of claim 1 wherein said gate structure and said semiconductor device have a design rule less than 0.1 $\mu$m.

15. A method of fabrication of L-shaped spacers in a semiconductor device, comprising the steps of:
   a) providing a gate structure over a substrate;
   b) forming a firs dielectric layer over said gate structure and said substrate; said first dielectric layer formed using an atomic layer deposition process; said first dielectric layer formed by an atomic layer deposition process using tetraisocyanatesilane and water, and said first dielectric layer comprised of oxide; said first dielectric layer has a thickness of between about 50 and 200 Å; said first dielectric layer formed at a temperature between about 200 and 400° C.;
   c) forming a second dielectric layer over said first dielectric layer; said second dielectric layer formed using an atomic layer deposition process;
   d) forming a third dielectric layer over said second dielectric layer; said third dielectric layer formed using an atomic layer deposition process;
   e) etching said third dielectric layer to form a disposable spacer on said second dielectric layer,
   f) anisotropically etching said second dielectric layer and said first dielectric layer using said disposable spacer as a mask to form a top and a bottom L-shaped spacer, and
   g) removing said disposable spacer.

16. A method of fabrication of L-shaped spacers in a semiconductor device, comprising the steps of:
   a) providing a gate structure over a substrate;
   b) forming a first dielectric layer over said gate structure and said substrate; said first dielectric layer formed using an atomic layer deposition process;
   c) forming a second dielectric layer over said first dielectric layer; said second dielectric layer formed using an atomic layer deposition process; said second dielectric layer is formed by an atomic layer deposition (ALD) process using trimethyaluminum (TMA) and ozone and water and said second dielectric layer comprised of aluminum oxide, said second dielectric layer formed at a temperature between 400 and 450° C.;

d) forming a third dielectric layer over said second dielectric layer; said third dielectric layer formed using an atomic layer deposition process;

e) etching said third dielectric layer to form a disposable spacer on said second dielectric layer;

f) anisotropicly etching said second dielectric layer and said first dielectric layer using said disposable spacer as a mask to form a top and a bottom L-shaped spacer, and g) removing said disposable spacer.

17. A method of fabrication of L-shaped spacers in a semiconductor device, comprising the steps of:

a) providing a gate structure over a substrate;

b) forming a first dielectric layer over said gate structure and said substrate; said first dielectric layer formed using an atomic layer deposition process;

c) forming a second dielectric layer over said first dielectric layer; said second dielectric layer formed using an atomic layer deposition process;

d) forming a third dielectric layer over said second dielectric layer, said third dielectric layer formed using an atomic layer deposition process; said third dielectric layer formed by an atomic layer deposition process using tetraisocyanatesilane and water; said third dielectric layer comprised of oxide, said third dielectric layer formed at a temperature between 200 and 400° C.;

e) etching said third dielectric layer to form a disposable spacer on said second dielectric layer;

f) anisotropically etching said second dielectric layer and said first dielectric layer using said disposable spacer as a mask to form a top and a bottom L-shaped spacer; and g) removing said disposable spacer.

* * * * *

UNITED STATES PATENT AND TRADEMARK OFFICE
CERTIFICATE OF CORRECTION

| | | |
|---|---|---|
| PATENT NO. | : 6,664,156 B1 | Page 1 of 1 |
| APPLICATION NO. | : 10/209573 | |
| DATED | : December 16, 2003 | |
| INVENTOR(S) | : Chew Ang et al. | |

It is certified that error appears in the above-identified patent and that said Letters Patent is hereby corrected as shown below:

In issued Claim 5, col. 7, line 47, "aluminium," should read --aluminum--.

In issued Claim 7, col. 7, line 60, "lightdoped" should read --light doped--.

In issued Claim 15, col. 8, line 33, "firs" should read --first--.

In issued Claim 16, col. 9, line 9, "anisotropicly" should read --anisotropically--.

Signed and Sealed this

Twenty-sixth Day of December, 2006

JON W. DUDAS
*Director of the United States Patent and Trademark Office*